United States Patent [19]
Liu

[11] Patent Number: 5,843,835
[45] Date of Patent: Dec. 1, 1998

[54] DAMAGE FREE GATE DIELECTRIC PROCESS DURING GATE ELECTRODE PLASMA ETCHING

[75] Inventor: Ming-Hsi Liu, Chung-Li, Taiwan

[73] Assignee: Winbond Electronics Corporation, Hsinchu, Taiwan

[21] Appl. No.: 625,975

[22] Filed: Apr. 1, 1996

[51] Int. Cl.[6] .................................................. H01L 21/28
[52] U.S. Cl. ...................... 438/585; 438/592; 438/593; 438/595; 438/719; 438/740; 438/910
[58] Field of Search ..................... 438/585, 592, 438/593, 595, 719, 740, 910

[56] References Cited

U.S. PATENT DOCUMENTS

| | | | |
|---|---|---|---|
| 5,145,797 | 9/1992 | Nakanishi | 437/43 |
| 5,384,268 | 1/1995 | Lur et al. | 437/20 |
| 5,393,701 | 2/1995 | Ko et al. | 438/910 |
| 5,436,176 | 7/1995 | Shimizu et al. | 437/27 |
| 5,472,892 | 12/1995 | Gwen et al. | 438/592 |
| 5,490,830 | 2/1996 | Liao et al. | 438/585 |
| 5,545,578 | 8/1996 | Park et al. | 438/592 |
| 5,596,207 | 1/1997 | Krishnan et al. | 257/48 |

FOREIGN PATENT DOCUMENTS 61-129872  6/1986  Japan .

OTHER PUBLICATIONS

C. T. Gabriel, J.P. McVittie, *How Plasma Etching Damages Thin Gate Oxide,* Solid State Technology, pp. 81–87, Jun. 1992.

*Primary Examiner*—John Niebling
*Assistant Examiner*—Thomas G. Bilodeau
*Attorney, Agent, or Firm*—Meltzer, Lippe, Goldstein, Wolf, & Schlissel, P.C.

[57] ABSTRACT

In a CMOS device uses a thin oxide film as a gate dielectric film, gate electrode plasma etching frequently induces gate dielectric damage. This invention discloses a process which can form a damage free gate dielectric even though there is plasma nonuniformity during gate electrode etching. In this invention, a thin polysilicon layer is formed on the gate dielectric (gate oxide) layer and a thin oxide layer (not gate oxide) is formed on the thin polysilicon layer. The thin oxide layer (not gate oxide) is then patterned and etched to expose portions of the thin polysilicon layer. A thick polysilicon layer used to form the gate electrode is subsequently deposited. The thick polysilicon layer contacts the exposed portion of the underlying thin polysilicon layer, but is otherwise separated from the thin polysilicon layer by the thin oxide. The thin polysilicon layer is patterned and etched using a plasma etching process. The thin oxide (not the gate oxide) acts as an etching stop. There is no isolated polysilicon during the plasma etching process because there is a layer of thin polysilicon under the etching stop thin oxide layer. The thin polysilicon layer covers the substrate. The gate electrodes formed in the thick polysilicon layer contact the thin polysilicon layer so that surface currents in the thin polysilicon layer balance the local nonuniformity in conduction currents in the plasma. No charge builds up on the gate electrode regions and no gate oxide damage occurs.

7 Claims, 7 Drawing Sheets

DAMAGE FREE GATE DIELECTRIC PROCESS DURING GATE ELECTRODE PLASMA ETCHING

FIELD OF THE INVENTION

The present invention relates to semiconductor IC manufacture. In particular, the present invention relates to forming a damage free gate using an electrode plasma etching process.

BACKGROUND OF THE INVENTION

Evidence is mounting that the primary cause of oxide damage during plasma etching is charge buildup on conductors. Some data show that plasma nonuniformity across the wafer surface plays a major role in this damage. Plasma nonuniformity produces electron and ion currents that do not balance locally and can generate oxide damage. The apparent sequence of events leading to charge-induced gate oxide damage during etching of a conductive gate electrode is shown in FIGS. 1A through 1C.

FIG. 1A illustrates a semiconductor structure in which a thin gate oxide 12 is formed on a silicon substrate 10. A polysilicon layer 14 is deposited on the gate oxide layer 12. A layer of photoresist is deposited on the polysilicon 14 and patterned to form a mask 16.

The exposed portions of the polysilicon 14 are etched using a plasma etching process to form a gate electrode from the polysilicon layer 14. The gate electrode 18 is the portion of the polysilicon layer 14 covered by the photoresist mask 16.

In FIG. 1A, nonuniformities in the plasma discharge produce locally unbalanced ion and electron currents. The electron current Je can be higher than the ion current Ji where the plasma potential is at a minimum. Where the plasma potential is a maximum, the opposite is true. In FIG. 1A, Ji>Je. Because the polysilicon layer 14 completely covers the wafer early in the etching process, surface currents balance the local nonuniformity in conduction currents from the plasma. No charge builds up, and no gate oxide damage occurs.

In FIG. 1B, as the endpoint of the plasma etching process is approached, the conductive polysilicon gate material becomes discontinuous and surface current paths in the polysilicon layer 14 are broken. Islands of polysilicon in the form of gate region 18 start to appear, and charge buildup may begin. The charging rate is determined by the net local current imbalance and the amount of exposed polysilicon area in the island 18. The island 18 ultimately becomes the gate electrode. Either a positive or negative charge can occur with a corresponding voltage buildup. The island voltage increases until the insulator underneath (the gate oxide) begins to conduct via a Fowler-Nordheim tunneling current.

In FIG. 1C, as etching continues, the size of the polysilicon island 18 decreases. Finally, when the etching endpoint is reached and the gate dimensions are defined by the mask pattern, only the gate electrode edges 19 are exposed to the plasma.

FIG. 1D shows an enlarged view of the region 22 of FIG. 1C. In FIG. 1D, current tunneling typically occurs at a weak point 24 in the gate dielectric 12. As tunneling current increases, weak points in the oxide are further damaged, permitting even greater current flow. This causes oxide breakdown and catastrophic device failure such as the shorted area 26 where the entire gate oxide 12 is shorted.

The conventional process for the plasma etching of a gate electrode is shown in FIG. 2A through 2E.

In FIG. 2A, in accordance with one embodiment, a silicon substrate 10 has an N-well 30 and a P-well 32 formed therein. The silicon substrate 10 is covered by an oxide layer 36 which has thick field oxide (FOX) regions 38 and thin gate dielectric regions 40 between the field oxide (FOX) regions 38.

In FIG. 2B, a layer of polysilicon 42 is deposited on the surface. Using a diffusion process technique, the polysilicon layer is then doped with phosphorous oxychloride ($POCl_3$) to reduce its resistance.

In FIG. 2C, a photoresist mask 44 is formed to define the polysilicon pattern.

In FIG. 2D, anisotropic plasma etching is used to remove the exposed portions of polysilicon layer 42 to form gate electrode regions 46. During the anisotropic plasma etching process, plasma is introduced and plasma nonuniformity can generate oxide damage in the gate oxide regions 40 in accordance with the mechanism discussed above.

In FIG. 2E, the photoresist mask 44 is removed.

The following prior art references may be pertinent to the formation of a gate electrode.

Calvin T. Gabriel, James P. McVittie, "How Plasma Etching Damages Thin Gate Oxides", Solid State Technology, Jun. 1992, pp. 81–87.

U.S. Pat. No. 5,436,176

U.S. Pat. No. 5,384,268

U.S. Pat. No. 5,145,797

It is an object of the invention to provide an improved process for forming a gate electrode in a semiconductor device.

More particularly, it is an object of the invention to provide a method form forming a gate electrode by plasma etching without damaging the gate oxide layer.

SUMMARY OF THE INVENTION

In a CMOS device that uses a thin oxide film as a gate dielectric film, gate electrode plasma etching frequently induces gate dielectric damage. This invention discloses a process which can form a damage free gate dielectric even though there is plasma nonuniformity during gate electrode etching.

In this invention, a thin polysilicon layer is formed on the gate dielectric (gate oxide) layer and a thin oxide layer (not gate oxide) is formed on the thin polysilicon layer. The thin oxide layer (not gate oxide) is then patterned and etched to expose portions of the thin polysilicon layer. A thick polysilicon layer used to form the gate electrode is subsequently deposited. The thick polysilicon layer contacts the exposed portion of the underlying thin polysilicon layer, but is otherwise separated from the thin polysilicon layer by the thin oxide.

The thick polysilicon layer is patterned and etched using a plasma etching process. The thin oxide (not the gate oxide) acts as an etching stop. There is no isolated polysilicon during the plasma etching process because there is a layer of thin polysilicon under the etching stop thin oxide layer. The thin polysilicon layer covers the substrate. The gate electrodes formed in the thick polysilicon layer contact the thin polysilicon layer so that surface currents in the thin polysilicon layer balance the local nonuniformity in conduction currents in the plasma. No charge builds up on the gate electrode regions and no gate oxide damage occurs.

DETAILED DESCRIPTION OF THE INVENTION

Figure 1A:
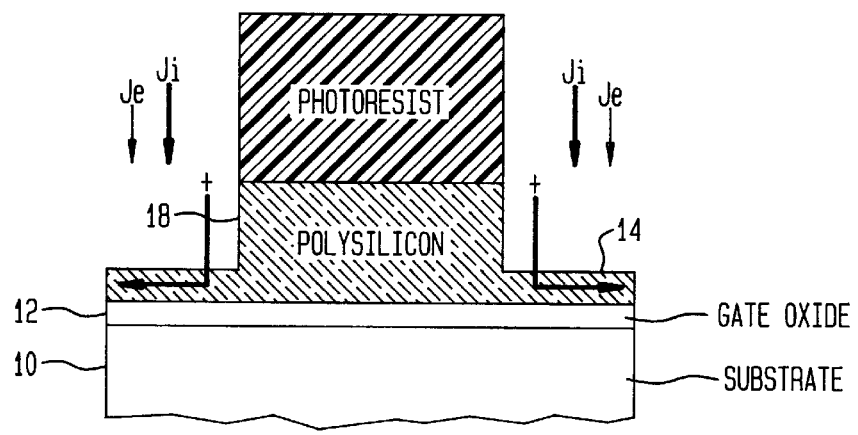
FIGS. 1A through 1D illustrate a sequence of events leading to charge-induced gate oxide damage during plasma etching of a conductive gate electrode.
Figure 1B:
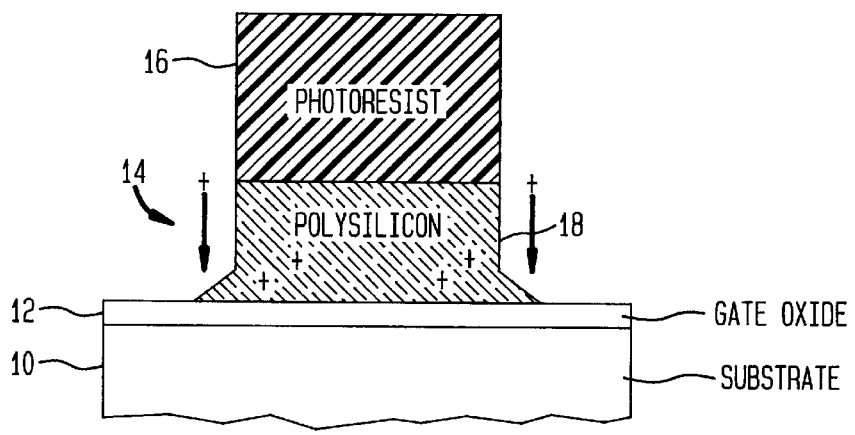
Figure 1C:
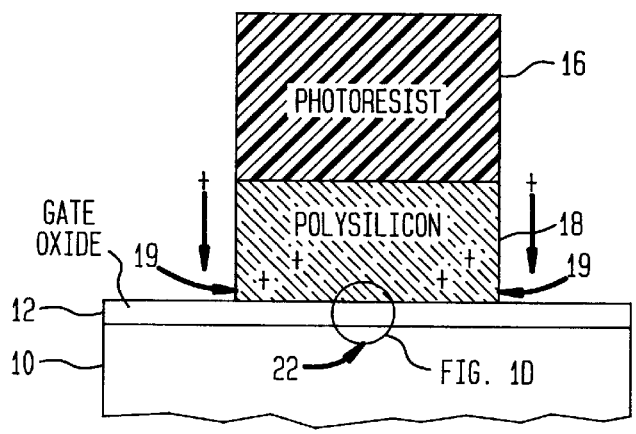
Figure 1D:
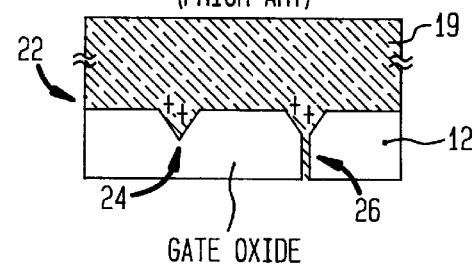
Figure 2A:
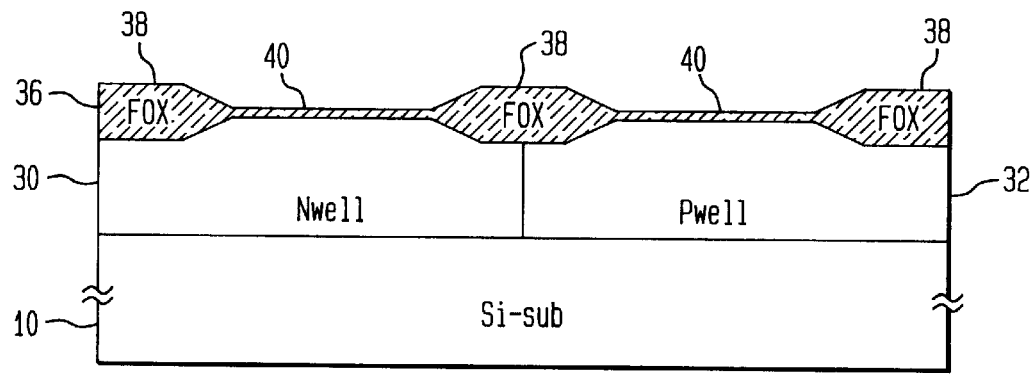
FIGS. 2A through 2E illustrate a prior art method for the formation of a gate electrode by plasma etching.
Figure 2B:
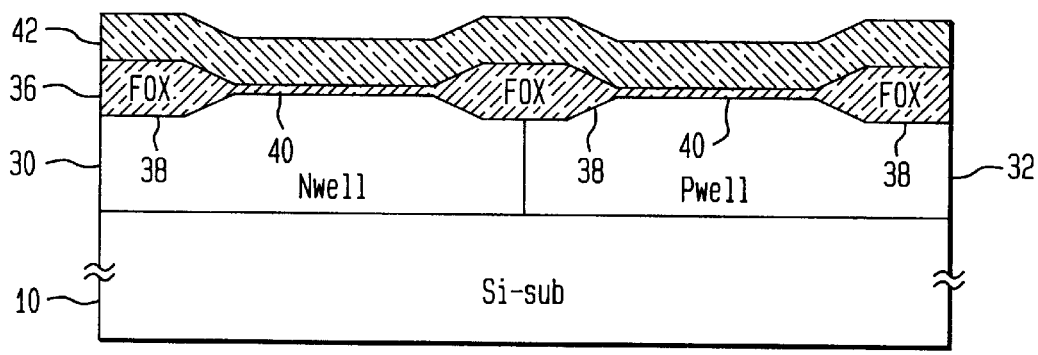
Figure 2C:
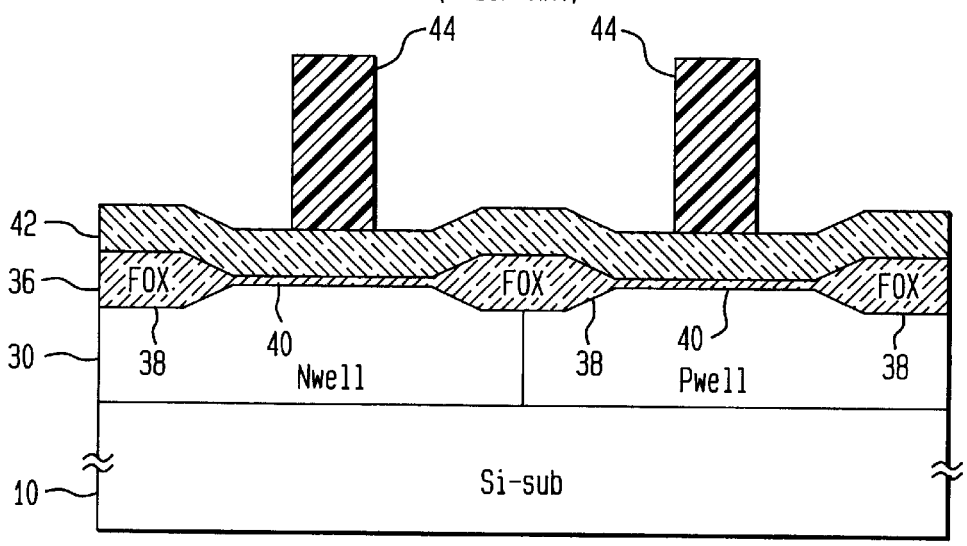
Figure 2D:
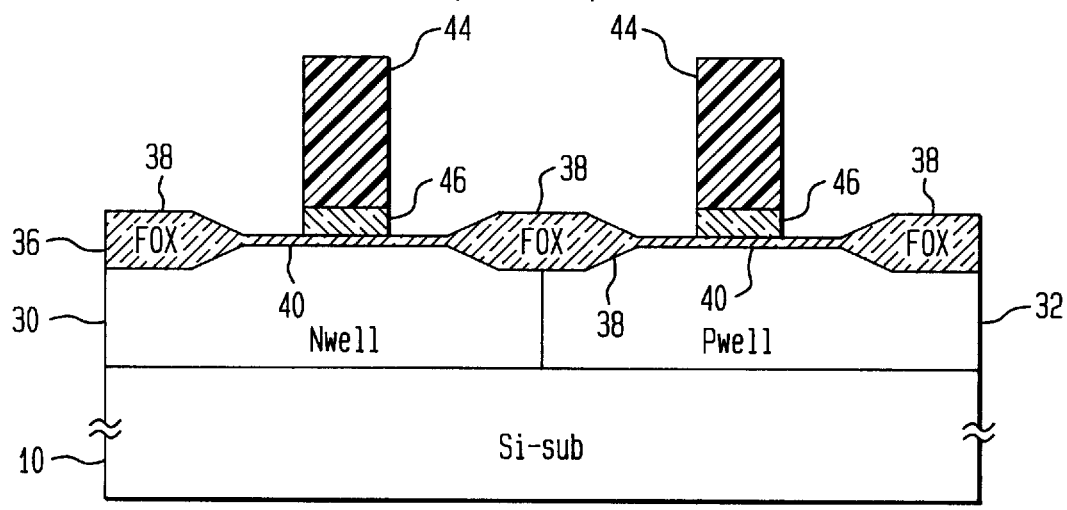
Figure 2E:
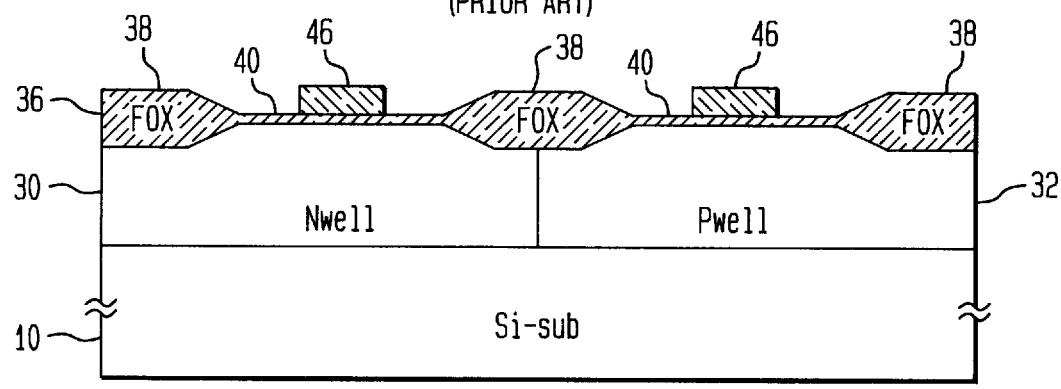
Figure 3:
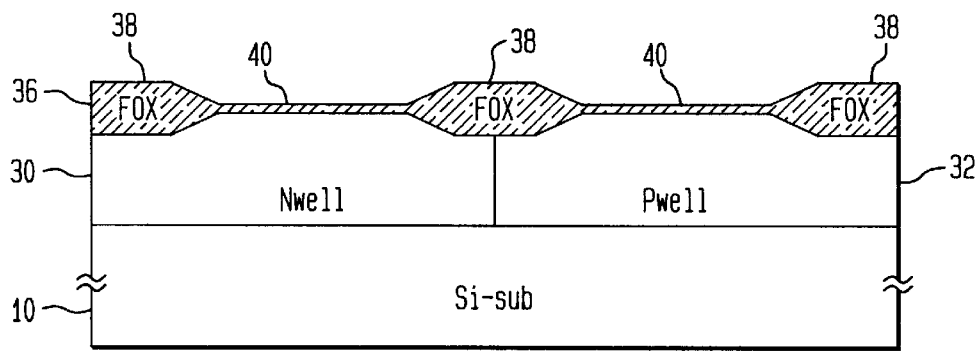
FIGS. 3 through 12 illustrate the inventive method that can effectively prevent gate dielectric damage during gate electrode plasma etching.

Referring now to FIG. 3, in accordance with one embodiment, a silicon substrate 10, with N-well 30 and P-well 32, is covered by an oxide layer 36 which has field oxide (FOX) regions 38 and gate dielectric regions 40 between the field oxide (FOX) regions 38. The N-well 30 has a depth of about 0.7 to 3.5 μm and a dopant concentration of about $10^{16}$ to $5 \times 10^{17}/cm^3$. The P-well 32 has a depth of about 0.7 to 3.5 μm and a dopant concentration of about $10^{16}$ to $5 \times 10^{17}/cm^3$. The field oxide regions 38 range in thickness from about 3000 to 8000 Angstroms, and provide device isolation. The gate dielectric regions 40 range in thickness from about 50 to 300 Angstroms.

Figure 4:
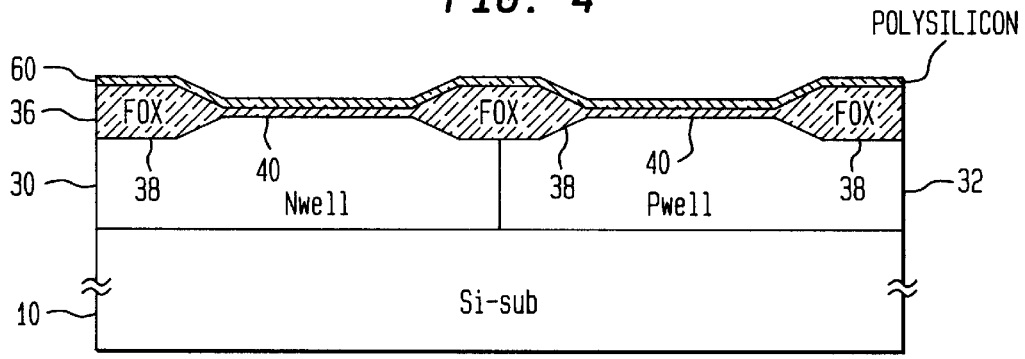

In FIG. 4, a thin polysilicon layer 60 is formed on the surface of the substrate 10 that ranges in thickness from about 100 to 300 angstroms.

Figure 5:
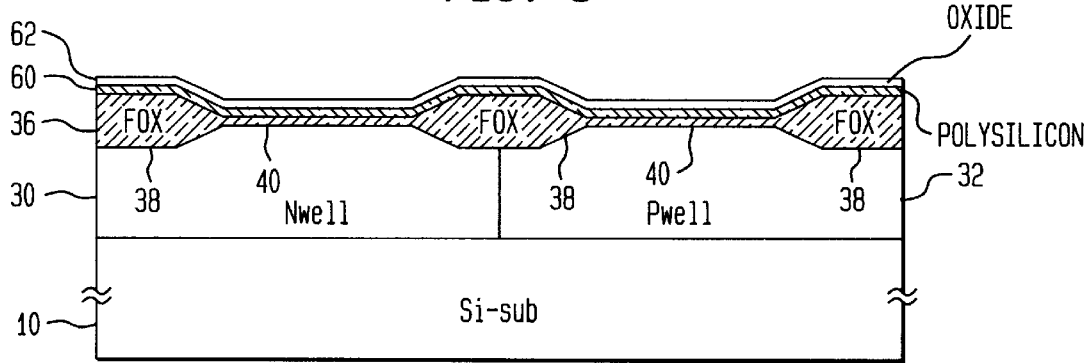

In FIG. 5, a thin oxide layer 62 is formed on the surface of the thin polysilicon layer 60. This thin oxide 62 can be formed by chemical vapor deposition (CVD) or thermal oxidation. The thermal oxidation takes place at a temperature range of about 800° to 1000° C. for about 10 to 70 minutes in $O_2$ or $H_2O$ ambient. The thin oxide layer ranges in thickness about 100 to 300 Angstroms.

Figure 6:
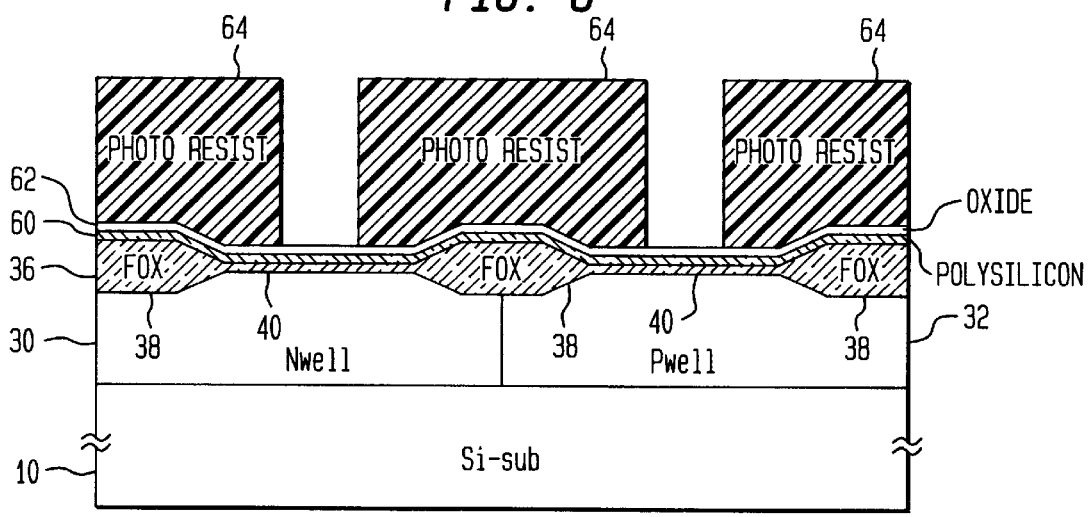

In FIG. 6, a photoresist mask 64 is formed to define a thin oxide layer pattern.

Figure 7:
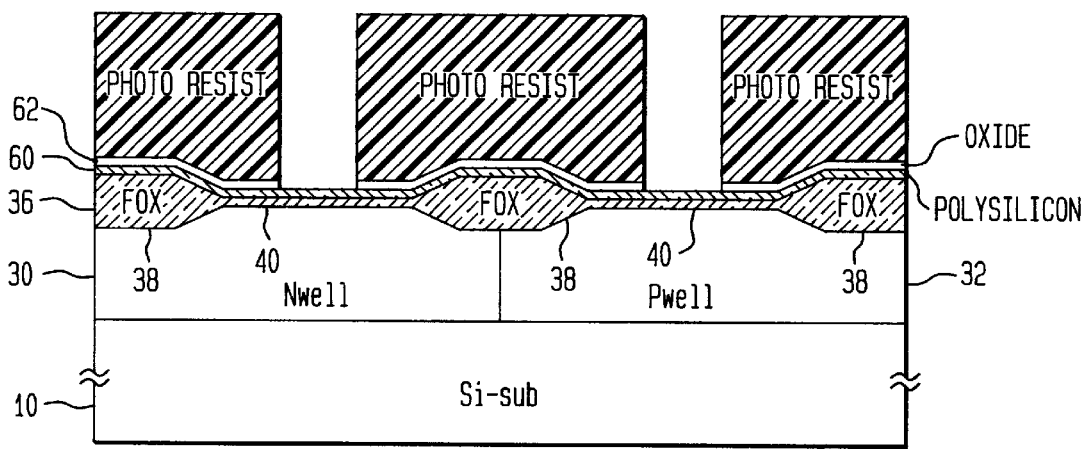

In FIG. 7, an anisotropic etching is performed and the exposed portions of the thin oxide layer 62 are removed. The thin polysilicon layer 60 functions as etching stop. The etching gas may be $CCl_2F_2$ or $CHF_3/CF_4$.

Figure 8:
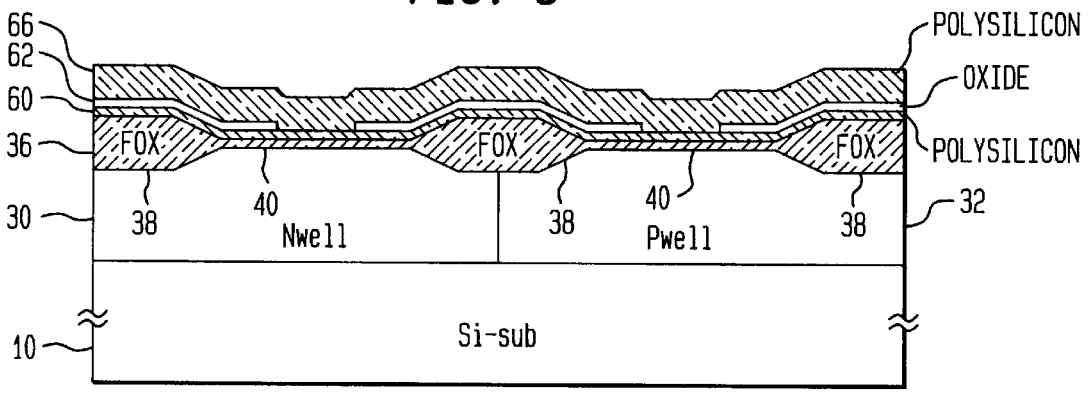

In FIG. 8, remove the photoresist mask 64, and deposit a layer of polysilicon 66. The polysilicon layer 66 ranges in thickness about 1500 to 4000 angstroms. Using a diffusion process technique, the polysilicon is then doped with phosphorous oxychloride ($POCl_3$) to reduce its resistance. The resistance of the polysilicon is reduced from about 500 to 2000 giga ohm/square before the diffusion process to a value of about 20 to 100 ohm/square after the diffusion process.

Figure 9:
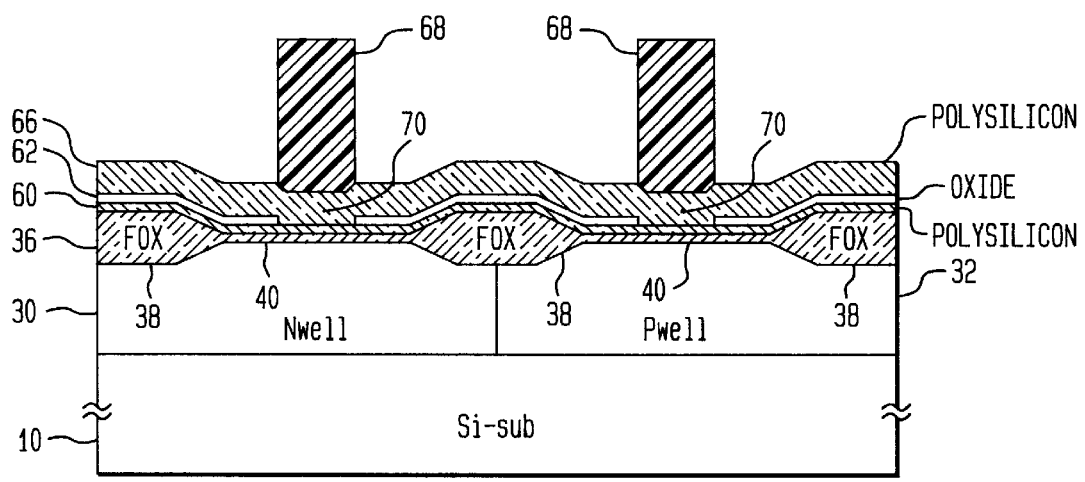

In FIG. 9, a photoresist mask 68 is formed to define a pattern in the polysilicon layer 66. The photoresist mask 68 is aligned to the edges of the remaining portions of the thin oxide layer 62. The portions 70 of polysilicon layer 66 which are covered by the photoresist mask 68, are in contact with the thin polysilicon layer 60.

Figure 10:
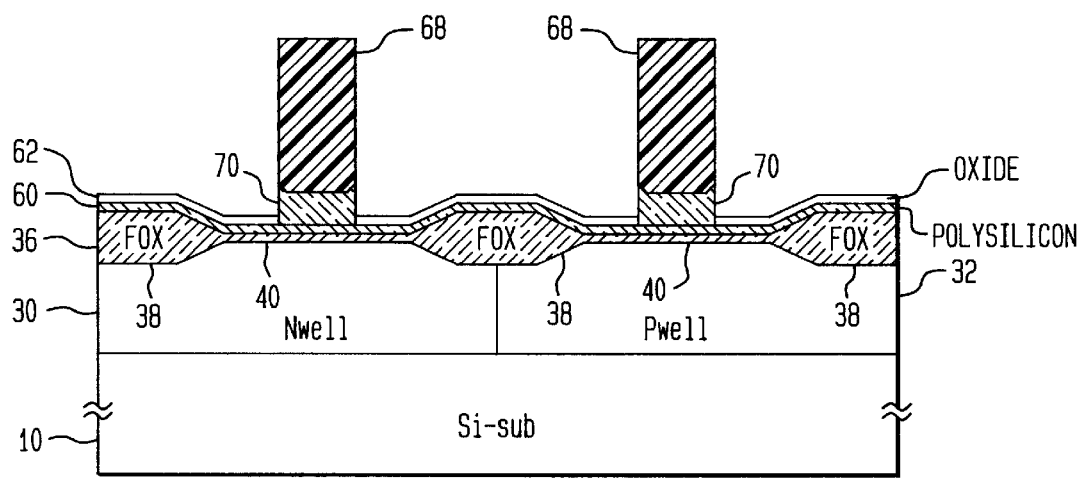

In FIG. 10, the exposed portions of polysilicon layer 66 are then ansiotropically etched away. The etching gas may be $HBr/Cl_2/O_2$ or $HBr/O_2$. The thin oxide layer 62 functions as etching stop. The gate electrode regions 70 remain as a result of etching the polysilicon layer 66. There is no oxide damage from non-uniform plasma currents because any local buildup in charge in the regions 70 is conducted away by surface currents in the thin polysilicon layer 60.

Figure 11:
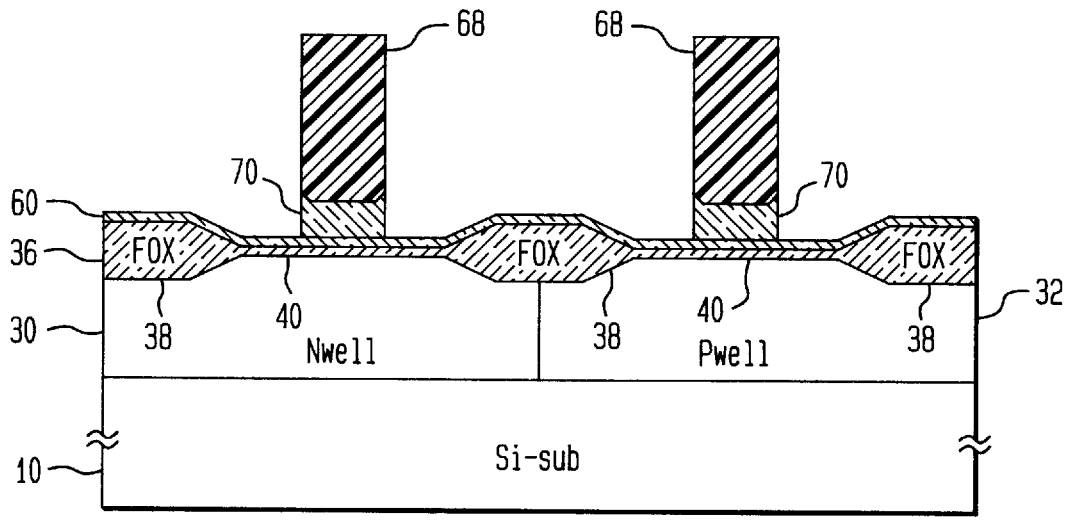

In FIG. 11, the exposed thin oxide layer 62 is then ansiotropically etched away. The etching gas may be $CCl_2F_2$ or $CHF_2/CF_4$. The thin polysilicon layer 60 functions as an etching stop.

Figure 12:
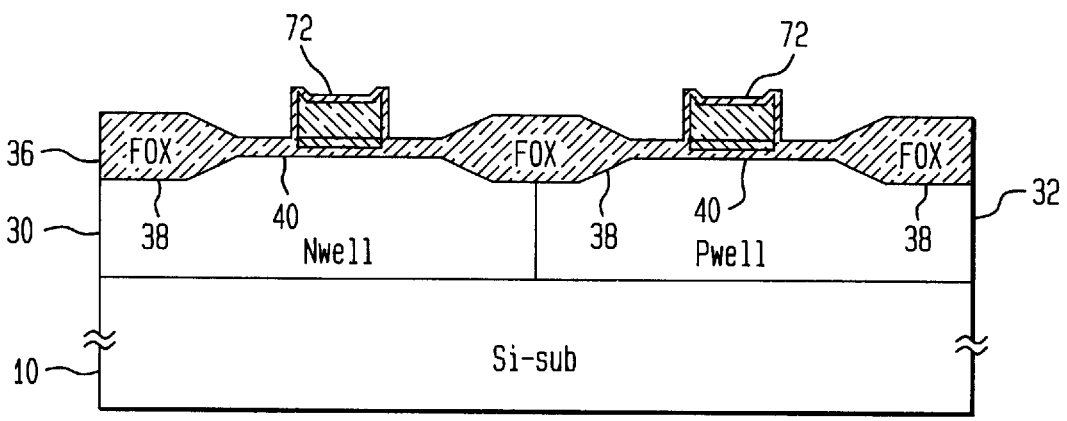

In FIG. 12, remove the photoresist mask 68, then a thermal oxidation is performed to oxidize the top and sides of the polysilicon gate electrodes 70 for the purpose of isolating the gate electrodes 70. The thermal oxidation takes place at a temperature range of about 800° to 1000° C. for about 10 to 90 minutes in $O_2$ or $H_2O$ ambient. As a result the top and sides of the gate electrodes 70 are covered with oxide 72 and the thin oxide regions 40 are now thicker.

In this invention, the gate electrodes are not isolated during the plasma etching process. Therefore, surface currents balance the local nonuniformity in conduction currents from plasma. No charge builds up, and no gate oxide damage occurs. The reason for this is that during plasma etching, the gate electrode regions 70 are always in contact with the thin conducting polysilicon layer 60.

In a preferred embodiment of the invention, the substrate is P-type but may also be N-type. In addition, the thin oxide layer 62 which acts as an etching stop may be formed by another material such as $Si_3N_4$. Finally, the above described embodiments of the invention are intended to be illustrative only. Numerous alternative embodiments of the invention may be formed by those skilled in the art without departing from the spirit and scope of the following claims.

I claim:

1. A method for forming a gate electrode in a semiconductor device comprising the steps of
   (a) forming a gate dielectric layer on a semiconductor substrate,
   (b) forming a first polysilicon layer on the gate dielectric layer,
   (c) forming an etch stop layer on the first polysilicon layer,
   (d) patterning the etch stop layer to form an opening therein to expose a selected portion of the first polysilicon layer,
   (e) depositing a second polysilicon layer on said etch stop layer, said second polysilicon layer contacts said exposed portion of said first polysilicon layer through said opening in said etch stop layer, and
   (f) patterning said second polysilicon layer using a plasma etching process to form a polysilicon gate electrode, said gate electrode comprising the portion of said second polysilicon layer in contact with said first polysilicon layer, said etch stop layer acting as an etch stop for said plasma etching process.

2. The method of claim 1 further comprising the steps of:
   (g) removing said etching stop layer, and
   (h) oxidizing exposed top and side surfaces of said gate electrode and said first polysilicon layer to isolate said gate electrode.

3. The method of claim 1 further including the step of forming oxide on exposed surfaces of said gate electrode.

4. The method of claim 3 wherein the etch stop layer is a silicon oxide.

5. The method of claim 1 wherein the etch stop layer is a silicon nitride.

6. A method for manufacturing a damage free gate dielectric during gate electrode plasma etching, said method comprising the steps of
   (a) depositing a gate dielectric layer on a silicon substrate,
   (b) depositing a first polysilicon layer on the gate dielectric layer,
   (c) depositing a etch stop dielectric layer on the first polysilicon layer,
   (d) forming a first photoresist mask on said etch stop dielectric layer, (e) removing a portion of said etch stop dielectric exposed by said first mask to form an opening in said etch stop dielectric layer, and removing said first mask, (f) depositing a second thick polysilicon layer over said etch stop layer, said second polysilicon layer contacting said first polysilicon layer through said opening in said etch stop layer, (g) forming a second photoresist mask on said second polysilicon layer to define a gate electrode region therein, said gate electrode region comprising the region of said second polysilicon in contact with said first polysilicon layer, (h) plasma etching said second polysilicon layer to remove a portion of said second polysilicon layer not covered by said second photoresist mask, and (i) removing said second photoresist mask to expose said gate electrode region.

7. The method of claim 6 further comprising the steps of:

(j) anisotropically etching away said etching stop layer, and (k) thermally oxidizing exposed top and side surfaces of said gate electrode and said first polysilicon layer so as to isolate said gate electrode.

* * * * *